US006411637B1

(12) United States Patent
Hashimoto

(10) Patent No.: US 6,411,637 B1
(45) Date of Patent: Jun. 25, 2002

(54) SEMICONDUCTOR LASER AND METHOD OF MANUFACTURING THE SAME

(75) Inventor: Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/324,758

(22) Filed: Jun. 3, 1999

(30) Foreign Application Priority Data

Jun. 8, 1998 (JP) .......................................... 10-159123

(51) Int. Cl.⁷ ................................................ H01S 5/22
(52) U.S. Cl. .......................................... 372/45; 372/46
(58) Field of Search ............................... 372/45, 46, 43

(56) References Cited

U.S. PATENT DOCUMENTS

| 4,794,611 A | * | 12/1988 | Hara et al. ..................... 372/45 |
| 4,882,734 A | * | 11/1989 | Scifres et al. .................. 372/45 |
| 5,144,633 A | * | 9/1992 | Ohnaka et al. ................. 372/45 |
| 5,251,224 A | * | 10/1993 | Irikawa ........................ 372/45 |

FOREIGN PATENT DOCUMENTS

| JP | 4-320082 | 11/1992 |
| JP | 6-204599 | 7/1999 |

OTHER PUBLICATIONS

English translation of the abstract of Japanese Patent Laid-open Publication No. 4-320082.

English translation of the abstract of Japanese Patent Laid-open Publication No. 6-204599.

* cited by examiner

Primary Examiner—Quyen Leung
Assistant Examiner—Jeffrey Zahn
(74) Attorney, Agent, or Firm—Smith, Gambrell & Russell, LLP

(57) ABSTRACT

A semiconductor laser with a separate confinement heterostructure (SCH) comprises an n-type GaInP lower cladding layer, a lower optical confinement layer, a GaInAs active layer, a upper optical confinement layer, and a p-type GaInP first upper cladding layer. These layers are successively grown on a n-type GaAs substrate. On the first upper cladding layer, an optical guiding layer and a p-type second cladding layer sandwiched by current blocking layers are provided. The lower optical confinement layer and the upper optical confinement layer have a super lattice structure of GaInAsP quantum well layers and GaInP barrier layers alternately stacked with each others.

4 Claims, 5 Drawing Sheets

SEMICONDUCTOR LASER AND METHOD OF MANUFACTURING THE SAME

BACKGROUND OF THE INVENTION

1. Field of the Invention

This invention relates to a semiconductor laser and its manufacturing method. Particularly, the invention relates to the semiconductor laser with an optical confinement layer.

2. Related Prior Art

With the progress in the optical communication and the optical information processing, a potential demand the semiconductor laser used in those application has grown. In particular, a semiconductor laser with a SCH structure (Separate Confinement Hetero-structure), in which the optical confinement layer and the carrier optical confinement layer are separated, is widely used because it shows a low threshold current and is easy to get a high optical output power.

Typical SCH laser has a stacking layer structure as shown in FIG. 5(a). The layers in the figure are an n-type GaInP lower cladding layer 104, an un-doped GaInAsP lower optical confinement layer 106, an un-doped GaInAs active layer 108, an un-doped GaInAsP upper optical confinement layer 110, and a p-type GaInP upper cladding layer 112. These layers are successively grown on a n-typeGaAs substrate.

FIG. 5(b) shows an typical energy band diagram of the SCH laser. In the figure, the band gap energy of the lower optical confinement layer 106 and the upper optical confinement layer 110 are larger than that of the active layer 108 by predetermined value enough to confine the carrier. Therefore, the carriers injected into the active layer 108 are effectively confined in the active layer 108.

The light generated in the active layer 108 leaks out to the lower optical confinement layer 106 and the upper optical confinement layer 110 because the thickness of the active layer is 0.1 $\mu$m or less. As shown in FIG. 5(c), the refractive index of the lower cladding layer 104 and the upper cladding layer 112 are smaller than that of the optical confinement layers, the light leaking out to the optical confinement layers does not propagate in the cladding layers. Thus, the light is confined in the two optical confinement layers 106, 110 and the active layer 108 by the two cladding layers 104, 112.

The threshold current, at which the semiconductor laser starts a lasing action, is effectively reduced in the SCH laser even when the thickness of the active layer is 0.1 $\mu$m or less, which is difficult in the double hetero ()H) laser without the optical confinement layer.

Moreover, since the light generated in the active layer 108 propagates not only in the carrier optical confinement layer but also in the optical confinement layers, an optical power density at the light emitting facet can be reduced and a high optical output laser can be obtained without catastrophic optical damage (COD) at the light emitting facet.

In such a SCH laser mentioned above, it is necessary to form optical confinement layers with an adequate band gap energy and refractive index. However, selecting the semiconductor material based on the band gap energy, its refractive index is automatically defined, because the refractive index and the band gap energy of a semiconductor material shows a particular relationship. Ternary, quaternary or more complicated semiconductor materials are often used for the optical confinement layer because the band gap energy of such semiconductor materials are widely adjustable by changing its composition.

It is also well known that such a ternary or quaternary semiconductor material has a miscibility gap in which the composite elements can not be mixed uniformly or the single crystal with a good quality can not be obtained. The miscibility gap widely exists in the growth temperatures from 400° C. to 800° C. which is typical growth condition for the semiconductor laser. It is very hard to grow a semiconductor layer with a desired band gap energy for the optical confinement layers from the composition out of the miscibility gap. Occasionally, it is impossible to get such semiconductor layers.

SUMARRY OF THE INVENTION

The object of the present invention is to provide a semiconductor laser with optical confinement layers which effectively confine both the carriers within the active layer and the light within the optical confinement layers and the active layer, and to provide a manufacturing method of the laser with such a optical confinement layers.

The semiconductor laser according to the present invention comprises a semiconductor substrate, the first and the second cladding layers on the substrate, an active layer between the first cladding layer and the second cladding layer, at least one optical confinement layer inserted between the active layer and the first cladding layer or the second cladding layer. The optical confinement layer according to the present invention includes a super lattice structure made of GaInAsP well layers and GaInP barrier layers, and each quantum well layer sandwiches a barrier layer.

In the super lattice structures, mini-bands, in which electrons or holes could move freely by tunneling effects, can be formed in the conduction band and the valence band by making the thickness of the quantum well layers and the barrier layers thin enough. The energy level difference between the mini-band of the conduction band and that of the valence band shows the same function as the band gap energy of the bulk material for the carrier confinement and the light confinement. Since the energy level difference between the mini-bands is determined by the thickness of the quantum well layers and that of the barrier layers, a super lattice structure with a desired energy level difference can be obtained by adjusting the thickness of the quantum well layers and the barrier layers. Therefore, the optical confinement layers, whose band gap energy is unrealizable in a bulk material due to the miscibility gap, can be obtained without difficulty by making the super lattice structure with the well layers and the barrier layers. Both layers are grown from the composition out of the miscibility gap under the growth temperature. GaInAsP and GaInP is the appropriate combination for the well layers and the barrier layers, respectively, because each material has the same growth conditions and the interface between them is hard to deteriorate.

The semiconductor laser according to the present invention has the energy level difference from 1.6 eV to 1.8 eV of the mini-bands in the optical confinement layer.

The method of manufacturing a semiconductor laser according to the present invention, which containing a semiconductor substrate, the first and the second cladding layer on the substrate, an active layer between the first cladding layer and the second cladding layer, and at least an optical confinement layer between the first cladding layer and the active layer or the second cladding layer and the active layer, has a step for forming an optical confinement layer with a super lattice structure made of a plurality of the GaInAsP quantum well layers and a plurality of the GaInP barrier layers.

By employing the super lattice structure for the optical confinement layer, the energy level difference between the mini-band of the conduction band and that of the valence band show the same function as the band gap energy of the bulk material for the carrier confinement and the light confinement. Since the energy level difference between the mini-bands is determined by the thickness of the quantum well layers and that of the barrier layers, a super lattice structure with a desired energy level difference can be obtained by adjusting the thickness of the quantum well layers and the barrier layers. The optical confinement layers, whose band gap energy is unrealizable in a bulk material due to the miscibility gap, can be obtained without difficulty by making the super lattice structure with the well layers and the barrier layers. Both layers are grown from the composition out of the miscibility gap under the growth temperatures. Moreover, since no particular manufacturing process is needed for the above mentioned optical confinement layers, decrease of productivity and the yield attributing to the change of the process conditions can not be occurred.

The present invention will become more fully understood from the detailed description given herein-below and the accompanying drawings which are given by way of illustration only, and thus are not to be considered as limiting the present invention. Further scope of applicability of the present invention will become apparent from the detailed description given hereinafter. However, it should be understood that the detailed description and specific examples, while indicating preferred embodiments of the invention, are given by way of illustration only, changes and modifications within the spirit and scope of the invention will become apparent to those skilled in the art from this detailed description.

DETAILED DESCRIPTION OF THE PREFERRED EMBODIMENTS

In the following, an embodiment according to the present invention will be described with reference to FIG. 1 to FIG. 4.

Figure 1:
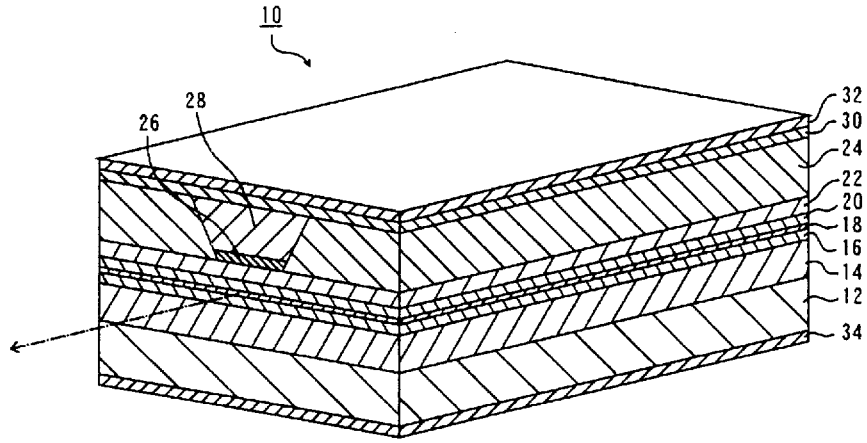
FIG. 1 is a perspective view showing the semiconductor laser according to the present invention.
Figure 2:
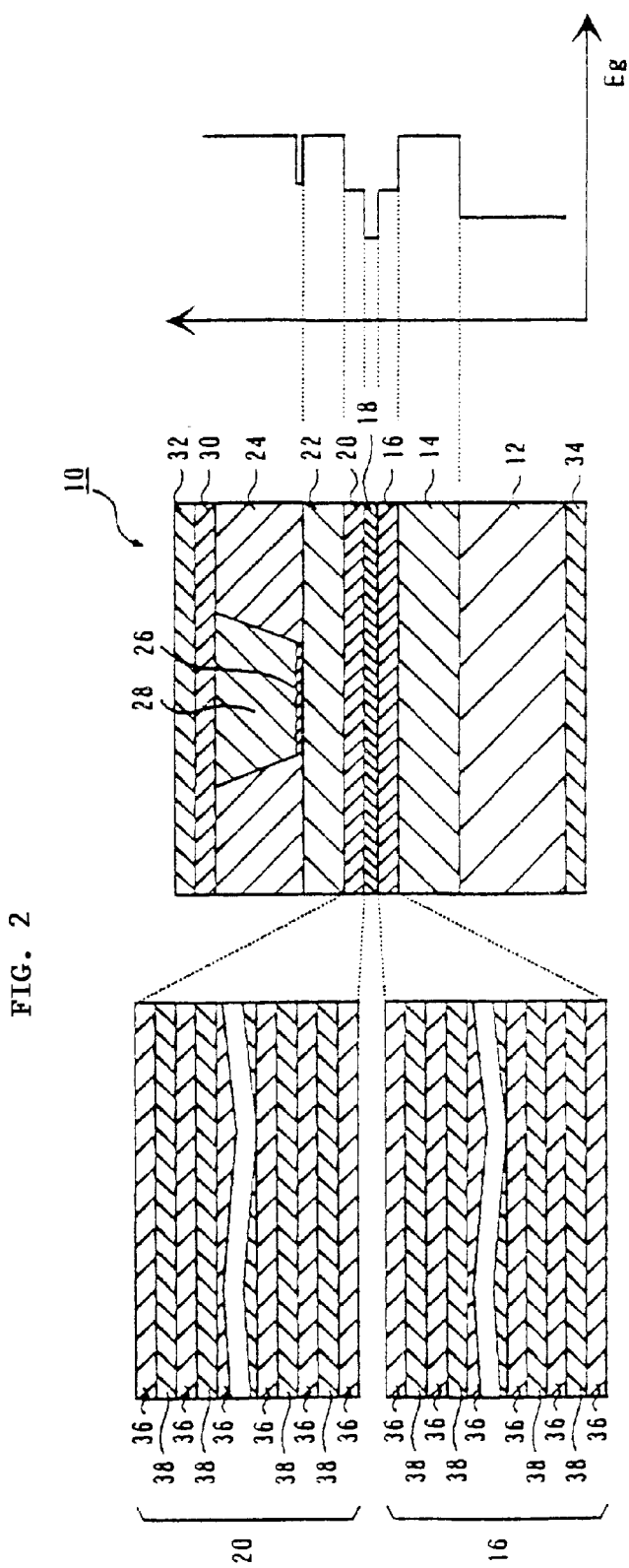
FIG. 2 is a cross-sectional view showing the stacking of each layer and the energy band diagram.

FIG. 1 is a view showing a semiconductor laser according to the present invention which emits light of 0.98 µm. FIG. 2 shows a cross-sectional view intersecting an light axis 1 in FIG. 1.

The semiconductor laser 10 comprises a semiconductor substrate 12, a lower cladding layer 14, a lower optical confinement layer 16, an active layer 18, an upper optical confinement layer 20, and a first upper cladding layer 22.

An optical guiding layer 26 and a second upper cladding layer 28 successively grown on the first upper cladding layer 22 are formed between two current blocking layers 24. A contact layer 30 is disposed on the current blocking layers 24 and the second upper cladding layer 28. An upper electrode 32 is formed on the contact layer 30, while a lower electrode 34 is formed on the other surface of the substrate 12.

The semiconductor substrate 12 is made of n-type GaAs and its thickness is about 100 µm. The lower cladding layer 14, the first upper cladding layer 22, and the second upper cladding layer 28 are made of n-type GaInP with thickness of 1.5 µm, p-type GaInP with thickness of 0.6 µm and p-type GaInP with thickness of 0.9 µm, respectively. The active layer 18 is made of GaInAs and its thickness is about 8 nm. The band gap energy of the active layer 18 is about 1.26 eV and emits light of 0.98 µm.

The current blocking layer 24 is made of n-type AlGaInP. The current blocking layer 24 prevents carriers flowing into the portion beneath the layer and concentrates carriers into the second upper cladding layer 28. The optical guiding layer 26 is made of p-type GaAs and its thickness is only about 15 nm. The guiding layer 26 increases the effective refractive index in the striped region between two blocking layers 24. Increasing the refractive index, the transverse mode of the emitted light can be effectively confined. The guiding layer 26 behaves as a etch stopping layer of the second upper cladding layer 28. In the present embodiment, the width of the striped region is about 4 µm. The contact layer 30 is p-type GaAq with thickness of about 1.5 µm and provided to decrease the contact resistance of the upper electrode 32. The upper electrode and the lower electrode are made of titanium/platinum/gold and germanium-gold/nickel/gold composite metal, respectively.

The lower optical confinement layer 16 and the upper optical confinement layer 18 are made of a plurality of quantum well layers 36 and a plurality of barrier layers 38. Both layers are sandwiched with each other. The quantum well layers 36 are GaInAsP quaternary material composed of Ga, In, As and P. The band gap energy of the well layers 36 at the bulk state is 1.58 eV. While, barrier layers 38 are GaInP ternary compound made by Ga, In, and P. The band gap energy of the barrier layers 38 at the bulk state is 1.85 eV which is larger than the well layers 36. The thickness of the well layers and the barrier layers are 1.4 nm and 2.1 nm, respectively. In this embodiment, fifteen quantum well layers 36 and fourteen barrier layers 38 stacked alternately build up the lower optical confinement 16 and the upper optical confinement layers 20.

Mini-bands are formed in both of the conduction band and the valence band in the optical confinement layers 16, 20 by stacking structure of the quantum well layers 36 and the barrier layers 38. The energy level difference between the mini-band formed in the conduction band and that of the valence band is about 1.66 eV.

Both the quantum well layers of GaInAsP 36 and the barrier layers of GaInP 38 are lattice matched to the GaAs substrate 12. The "lattice match" means the lattice constant of the GaInAsP quantum well layers 36 or that of the GaInP barrier layers 38 are nearly equal to the lattice constant of the GaAs substrate 12. Definitely, it is required that the lattice mismatch to the GaAs within ±0.1%.

The manufacturing method of the semiconductor laser according to the present invention will be explained in the following.

The manufacturing method of the present semiconductor laser is the same as known SCH lasers except for forming the optical confinement layers. The lower cladding layer 14, the lower optical confinement layer 16, fine structure of which will be explained later, the active layer 18, the upper optical confinement layer 20, the first upper cladding layer 22, the optical guiding layer 26 and the second upper cladding layer 28 are successively grown on the semiconductor substrate 12 by using the Organo-Metallic-Vapor-Phase-Epitaxy (OMVPE) method. After the growth, the stripe region of the optical guiding layer 26 and the second upper cladding layer are formed by etching the both sides. Using an etchant mainly composed of a hydrochloric acid, the optical guiding layer 26 acts as an etchstopping layer for the GaInP second upper cladding layer 28. While using an etchant mainly composed of a phosphoric acid, the GaInP first upper cladding layer 22 acts as an etch-stopping layer for the GaAs optical guiding layer 26. Then, the current blocking layers 24 are grown on the removed regions of both sides of the stripe region. A planar surface of the current blocking layers 24 and the second upper cladding layer 28 can be obtained. The second upper cladding layer 28 are grown again on the planar surface and the contact layer 20 are grown on the upper cladding layer 28. After the growth of all semiconductor layers, the upper electrode 32 and the lower electrode 34 are formed on both surfaces of the semiconductor layers.

The lower optical confinement layer 16 and the upper optical confinement layer 20 are formed as follows. Firstly, the first well layer 36 is epitaxially grown on the lower cladding layer 14 for the lower optical confinement layer 16 or on the active layer 18 for the upper optical confinement layer 20. Then, the first barrier layer 38 is grown on the well layer 36, and the second well layer 36 is grown on the barrier layer 38. The super lattice structure is formed by growing the well layer and the barrier layer alternately.

The thickness of the quantum well layers 36 and the barrier layers 38 is determined so that the energy level difference between the mini-band of the conduction band and that of the valence band is desired value. In the present embodiment, the thickness of the quantum well layers 36 and the barrier layers 38 are designed to be 1.4 nm and 2.1 nm, respectively. Then, the energy level difference between the mini-bands become 1.66 eV.

The number of stacking depends on the characteristics of the optical confinement. Fifteen well layers and fourteen barrier layers are stacked alternately in the present embodiment. The total thickness of the lower optical confinement layer 16 and the upper optical confinement layer 20 become 50 nm Different thickness is also applicable for each optical confinement layer.

The following is the characteristics of the present semiconductor laser 10 comparing with the conventional laser with a bulk optical confinement layer.

In the SCH laser, the carriers are confined in the active layer 18 while the light is confined in the optical confinement layers and the active layer. It is inevitable to enhance the carrier confinement that the band gap energy of the optical confinement layers is greater than that of the GaInAs active layer (=1.26 eV) and smaller than that of the GaInP cladding layers (=1.85 eV). Practically, more than 0.3 eV difference is desirable between the optical confinement layers and the active layer to achieve a sufficient carrier confinement. Therefore, the band gap energy of at least 1.6 eV is necessary for the optical confinement layers. Taking the temperature dependence of the laser characteristics into account, the band gap energy for the optical confinement layer 16, 20 must be from 1.6 eV to 1.8 eV to enhance the carrier confinement.

In the case where the optical confinement layer made of a GaInAsP bulk material is grown by OMVPE method, it is used to grow such a layer at temperatures from 600° C. to 700° C. Those growth conditions are disclosed in IEEE Journal of Quantum Electronics volume 30, No. 2, Febuary 1994, page 408. However, as shown in Japanese Journal of Applied Physics, volume 21, No 5, March 1982, page 797, GaInAsP lattice matched to GaAs has a wide miscibility gap region corresponding to the band energy gap from 1.6 eV to 1.8 eV. Therefore GaInAsP with such a band energy gap is quite hard to grow.

Figure 3:
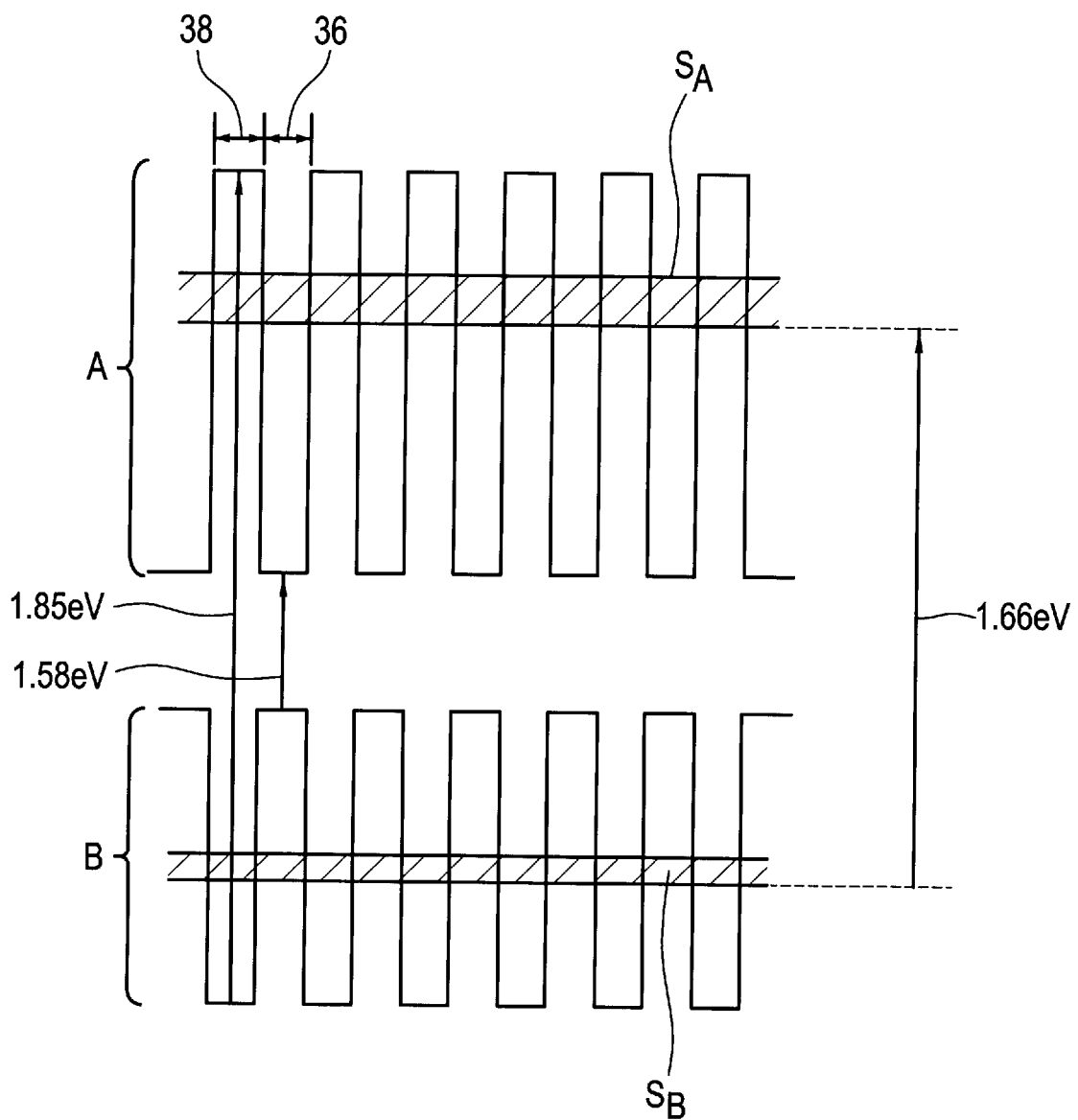
FIG. 3 is a energy band diagram of the optical confinement layer.

On the other hand, in the case where the optical confinement layer with an energy gap from 1.6 eV to 1.8 eV is formed with a super lattice structure according to the present invention, mini-bands are formed in both the conduction band and the valence band as shown in FIG. 3. Shown in the energy band diagram of FIG. 3, the mini-band SA within which electrons freely move by the tunneling effect is formed in the conduction band A, while the mini-band SB within which holes freely move is formed in the conduction band B. The energy level difference between the mini-bands, exactly the difference between the bottom level of the mini-band SA and the top level of the mini-band SB, shows an effect to confine the carriers within the active layer 18.

The energy level difference between the mini-bands can be adjusted without difficulty by changing the thickness of the quantum well layers 36 and the barrier layers 38. The GaInAsP quantum well layers 36 in the present embodiment have a band gap energy of 1.58 eV, while the GaInP barrier layers 38 have a band gap energy of 1.85 eV. Since the compositions of the GaInAsP and the GaInP with the above energy gap, respectively, are out of the miscibility gap at growth temperatures from 600° C. to 700° C., a super lattice structure with the energy level difference between the mini-bands from 1.58 eV to 1.85 eV can be formed without difficulty only by adjusting the thickness of the quantum well layers and the barrier layers.

The bulk semiconductor layers with a desired band gap energy whose corresponding composition is in the miscibility gap can be replaced by a super lattice structure made of different materials whose compositions are out of the miscibility gap. In the GaInAsP, which is widely used for the optical confinement layer, the band gap energy from 1.6 eV to 1.8 eV which is hard to realize from bulk materials are easily obtained as the energy level difference between two mini-bands created in the conduction band and the valence band.

The semiconductor laser 10 according to the present embodiment, the thickness of the quantum well layers 36 is 1.4 nm and that of the barrier layers 38 is 2.1 nm. The energy level difference between two mini-bands becomes about 1.66 eV in such configuration.

In the embodiment, the semiconductor substrate 12, the quantum well layers 36, and the barrier layers 38 are lattice matched with each other. Therefore, misfit dislocations due to lattice mismatch do not occur.

Since both optical confinement layers 16, 20 have simple stacking structures, additional process steps are not necessary compared with the fabricating process of the semiconductor laser with optical confinement layers made of bulk materials. Therefore, decrease of the productivity and the yield do not cause.

The combination of the quantum well layers 36 and the barrier layers 38 i s not restricted to the pair of GaInAsP and GaInP mentioned above. For example GaInAs with GaInP, InAs with GaP, or GaInP with GaAsP are also applicable.

Some materials among them are not lattice matched to the GaAs substrate. Even in such materials, a good crystalline quality with no misfit dislocations can be maintained by setting the thickness of the individual quantum layer or the barrier layer thinner than the critical layer thickness. "Critical layer thickness" means, when a semiconductor layer B with a lattice constant is epitaxially grown on a semiconductor layer, whose lattice constant is different from that of the semiconductor layer B, the thickness of the semiconductor layer B at which dislocations are induced in the semiconductor layer B. A semiconductor layer with no dislocations could be grown on a semiconductor with a different lattice constant by making the thickness thinner than the critical layer thickness.

Design and fabrication step of the super lattice structure would be more simplified by employing binary or ternary compound materials instead of quaternary materials.

Although both sides of the active layer 18 provide the optical confinement layers in the present embodiment, a configuration in which the only one side of the active layer has the optical confinement layer is also applicable.

Figure 4:
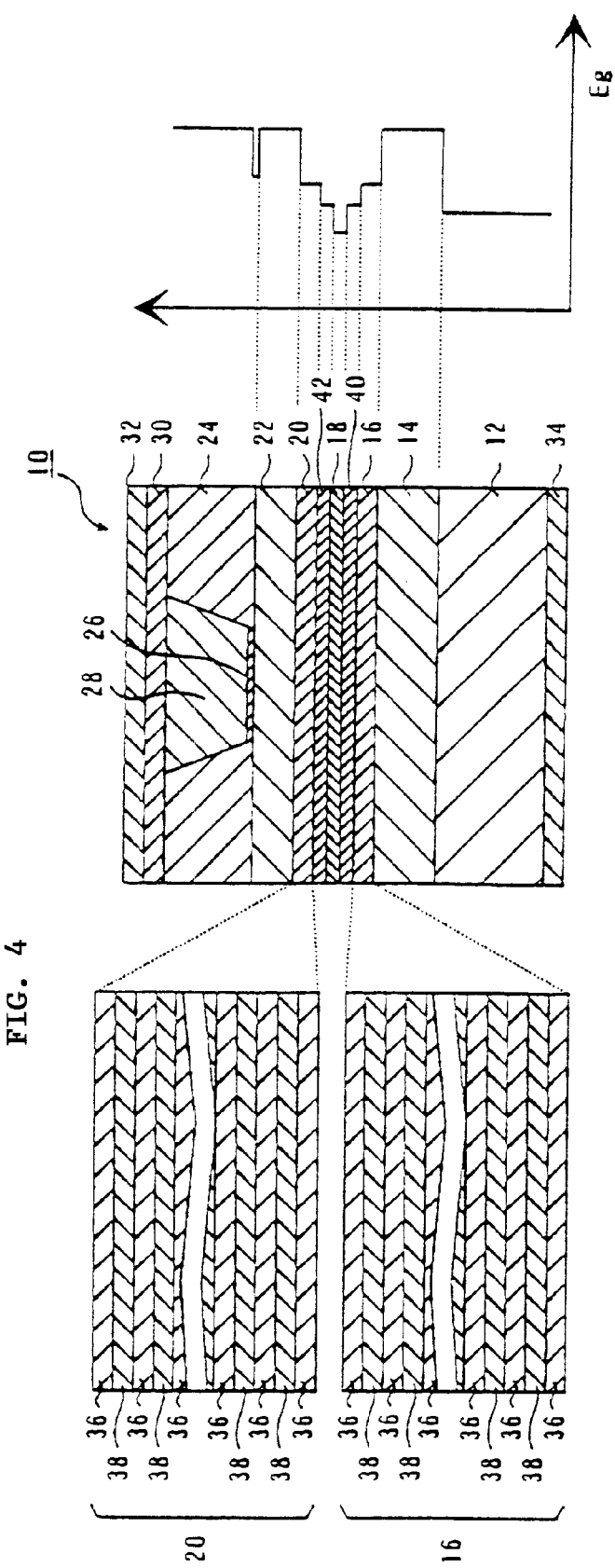
FIG. 4 is a cross-sectional view showing the stacking of layers and the energy band diagram of another embodiment of the present invention.
Figure 5:
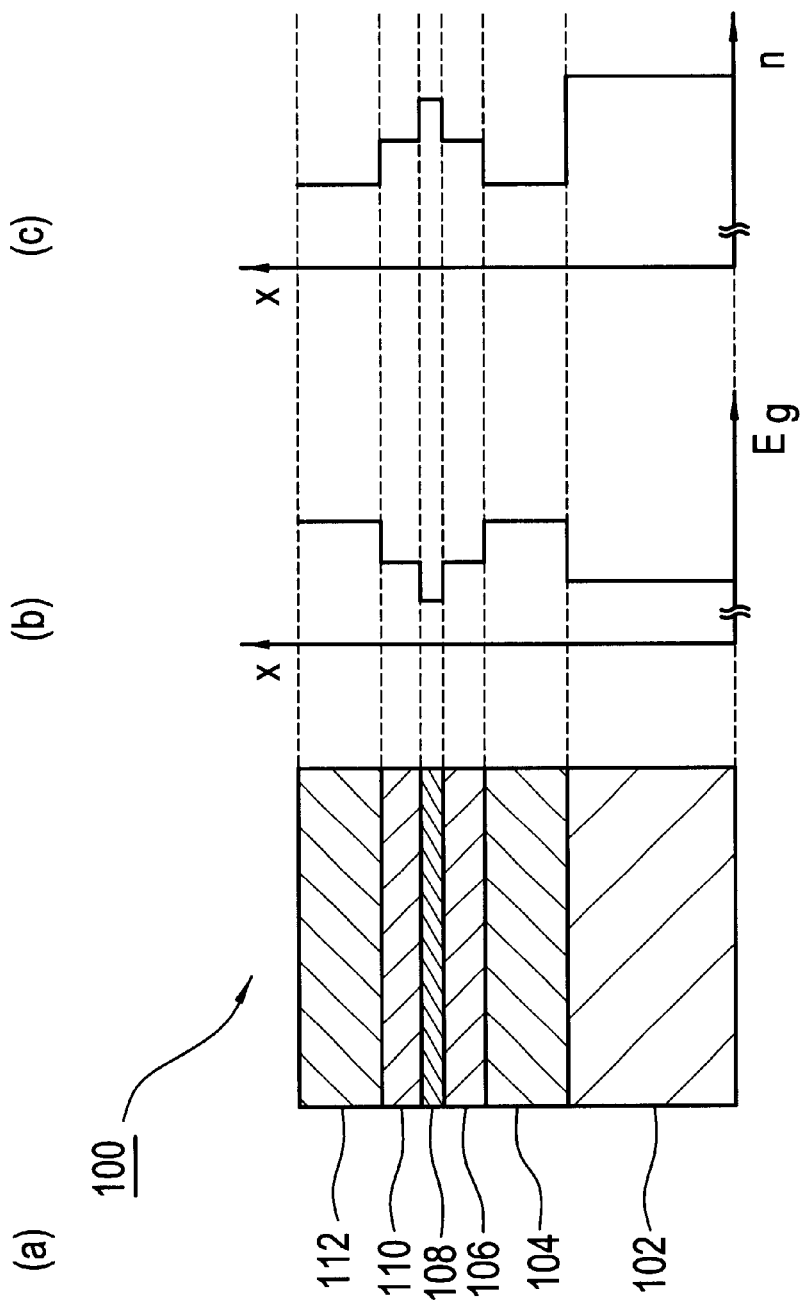
FIG. 5 is a cross-sectional view showing the stacking structure and the energy band diagram of the conventional semiconductor laser.

Additional layer 40 with a band gap energy smaller than the energy level difference between the mini-bands of the optical confinement layers 16, 20 but larger than that of the active layer 18 is also applicable between the active layer 18 and the optical confinement layers 16, 20 as shown in FIG. 4. An un-doped GaInAsP layer 40, in which the band gap energy is 1.58 eV and the thickness is out 20 nm, is inserted between the active layer 18 and the lower optical confinement layer 16 and between the active layer 18 and the upper optical confinement layer 20.

In this configuration, the lower optical confinement layer 16 and the lower layer 40 or the upper optical confinement layer 20 and the upper layer 42 forms a kind of graded index (GRIN) structure. A spike due to the energy band discontinuity at the hetero-interface between the cladding layer and the optical confinement layer is suppressed by the GRIN structure which results in a decrease of an electrical resistance. In addition, a carrier injection efficiency into the active layer 18 is enhanced by the GRIN structure because of the spike suppression at the interface and an internal electric field. The super lattice structure is also applicable to the lower layer 40 and the upper layer 42.

What is claimed is:

1. A semiconductor laser comprising:

a semiconductor substrate;

a lower cladding layer provided on said substrate;

an active layer provided on said lower cladding layer;

an upper cladding layer provided on said active layer;

a lower optical confinement layer provided between said lower cladding layer and said active layer; comprising a super lattice structure of GaInP barrier layers having a band gap energy of 1.85 eV and GaInAsP quantum well layers having a band gap energy of 1.58 eV sandwiched together;

an upper optical confinement layer provided between said upper cladding layer and said active layer comprising a super lattice structure of GaInP barrier layers having a band gap energy of 1.85 eV and GaInAsP quantum well layers having a band gap energy of 1.58 eV sandwiched together;

wherein both the quantum well layers of GaInAsP and the barrier layers of GaInP are lattice matched to the GaAs substrate;

a lower layer of GaInAsP provided between said active layer and said lower optical confinement layer; and an upper layer of GaInAsP provided between said active layer and said upper optical confinement layer;

wherein both said lower optical confinement layer and upper optical confinement layer provide a mini-band in a conduction band and another mini-band in a valence band forming an energy level difference ranging from 1.6 eV to 1.8 eV by adjusting the thickness of the quantum well layers and the barrier layers.

2. A semiconductor laser according to claim 1, wherein said active layer is made of GaInAs, and said lower cladding layer and said upper cladding layer are made of GaInP.

3. A semiconductor laser comprising:

a semiconductor substrate;

a lower cladding layer provided on said substrate;

an active layer provided on said lower cladding layer;

an upper cladding layer provided on said active layer;

a lower optical confinement layer provided between said lower cladding layer and said active layer; comprising a super lattice structure of GaInP barrier layers having a band gap energy of 1.85 eV and GaInAsP quantum well layers having a band gap energy of 1.58 eV sandwiched together; and an upper optical confinement layer provided between said upper cladding layer and said active layer; comprising a super lattice structure of GaInP barrier layers having a band gap energy of 1.85 eV and GaInAsP quantum well layers having a band gap energy of 1.58 eV sandwiched together;

wherein both the quantum well layers of GaInAsP and the barrier layers of GaInP are lattice matched to the GaAs substrate;

wherein both said lower optical confinement layer and upper optical confinement layer provide a mini-band in a conduction band and another mini-band in a valence band forming an energy level difference ranging from 1.6 eV to 1.8 eV by adjusting the thickness of the quantum well layers and the barrier layers.

4. A semiconductor laser according to claim 3, wherein said active layer is made of GaInAs, and said lower cladding layer and said upper cladding layer are made of GaInP.

* * * * *